(12) United States Patent
Moon et al.

(10) Patent No.: US 10,479,932 B2
(45) Date of Patent: Nov. 19, 2019

(54) PHOSPHOR COMPOSITION, LIGHT-EMITTING DEVICE PACKAGE INCLUDING SAME, AND LIGHTING DEVICE

(71) Applicant: LG INNOTEK CO., LTD., Seoul (KR)

(72) Inventors: Ji Wook Moon, Seoul (KR); Woo Seuk Song, Seoul (KR); Seung Jae Lee, Seoul (KR); Jin Sung Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/097,349

(22) PCT Filed: Apr. 28, 2017

(86) PCT No.: PCT/KR2017/004608
§ 371 (c)(1),
(2) Date: Oct. 29, 2018

(87) PCT Pub. No.: WO2017/188795
PCT Pub. Date: Nov. 2, 2017

(65) Prior Publication Data
US 2019/0136129 A1     May 9, 2019

(30) Foreign Application Priority Data
Apr. 29, 2016  (KR) ........................ 10-2016-0052942

(51) Int. Cl.
*C09K 11/59*     (2006.01)
*C09K 11/61*     (2006.01)
(Continued)

(52) U.S. Cl.
CPC .......... *C09K 11/59* (2013.01); *C09K 11/0883* (2013.01); *C09K 11/61* (2013.01);
(Continued)

(58) Field of Classification Search
CPC ..... C09K 11/59; C09K 11/0883; C09K 11/61; C09K 11/616; C09K 11/617; C09K 11/77;
(Continued)

(56) References Cited

U.S. PATENT DOCUMENTS

2011/0220920 A1   9/2011   Collins et al.
2012/0212123 A1   8/2012   Sakuta et al.
(Continued)

FOREIGN PATENT DOCUMENTS

JP   2012-178574   9/2012
KR   10-2004-0019177   3/2005
(Continued)

OTHER PUBLICATIONS

International Search Report (with English Translation) and Written Opinion dated Aug. 21, 2017 issued in Application No. PCT/KR2017/004608.

*Primary Examiner* — Anne M Hines
(74) *Attorney, Agent, or Firm* — Ked & Associates, LLP

(57) ABSTRACT

According to an embodiment, a phosphor composition and a light-emitting device package including the same includes a first phosphor excited by an excited light source so as to emit light of a first wavelength area; a second phosphor excited by the excited light source so as to emit light of a second wavelength area; and a third phosphor excited by the excited light source so as to emit light of a third wavelength area. Therefore, light emitted from the phosphor composition has an improved color rendering index due to an increase in the intensity of light in a cyan wavelength area, and has an improved light velocity due to a shortened wavelength of light in a red wavelength area.

20 Claims, 11 Drawing Sheets

(51) Int. Cl.
*C09K 11/77* (2006.01)
*F21S 2/00* (2016.01)
*H01L 33/36* (2010.01)
*H01L 33/48* (2010.01)
*H01L 33/56* (2010.01)
*C09K 11/08* (2006.01)

(52) U.S. Cl.
CPC .......... *C09K 11/616* (2013.01); *C09K 11/617* (2013.01); *C09K 11/77* (2013.01); *C09K 11/7734* (2013.01); *F21S 2/00* (2013.01); *H01L 33/36* (2013.01); *H01L 33/48* (2013.01); *H01L 33/56* (2013.01); *Y02B 20/181* (2013.01)

(58) Field of Classification Search
CPC ........ C09K 11/7734; F21S 2/00; H01L 33/36; H01L 33/56
See application file for complete search history.

(56) References Cited

U.S. PATENT DOCUMENTS

| | | |
|---|---|---|
| 2013/0264937 A1 | 10/2013 | Sakuta et al. |
| 2014/0138728 A1 | 5/2014 | Moon et al. |
| 2016/0276549 A1 | 9/2016 | Yamashita et al. |
| 2017/0062668 A1* | 3/2017 | Yoshimura ............ H01L 33/504 |
| 2017/0279012 A1* | 9/2017 | Yoshimura ......... C09K 11/0883 |
| 2018/0240944 A1* | 8/2018 | Yoshimura ............ H01L 33/502 |

FOREIGN PATENT DOCUMENTS

| | | |
|---|---|---|
| KR | 10-2012-0118469 | 10/2012 |
| KR | 10-2014-0063066 | 5/2014 |
| KR | 10-2016-0041469 | 4/2016 |
| WO | WO 2015/068513 | 5/2015 |

\* cited by examiner

PHOSPHOR COMPOSITION, LIGHT-EMITTING DEVICE PACKAGE INCLUDING SAME, AND LIGHTING DEVICE

CROSS-REFERENCE TO RELATED PATENT APPLICATIONS

This application is a U.S. National Stage Application under 35 U.S.C. § 371 of PCT Application No. PCT/KR2017/004608, filed Apr. 28, 2017, which claims priority to Korean Patent Application No. 10-2016-0052942, filed Apr. 29, 2016, whose entire disclosures are hereby incorporated by reference.

TECHNICAL FIELD

An embodiment relates to a phosphor composition including a cyan fluorescent material, and a light emitting device package and a lighting device including the same.

BACKGROUND ART

Light emitting devices such as light emitting diodes and laser diodes using semiconductors III-V or II-VI compound semiconductors can be used for various colors such as red, green, blue, and ultraviolet and it is possible to implement white light with high efficiency by using fluorescent material or color combination. It has low power consumption, semi-permanent lifetime, fast response speed, safety, and environment friendliness compared to conventional light sources such as fluorescent lamps and incandescent lamps.

In the method of implementing white light, a fluorescent material is bonded on a blue or ultraviolet (UV) light emitting diode chip by a single chip type, and a method in which a fluorescent material is manufactured in a multi-chip form and a white light is obtained by combining them.

In the case of a multi-chip type, there is a typical method of manufacturing three kinds of chips of RGB (Red, Green, and Blue).

Further, in the case of implementing white light by a single chip, a method of using light emitted from a blue LED and exciting at least one of the phosphors using the light to obtain white light is used.

On the other hand, when a red phosphor is used for the phosphor composition in order to improve the color rendering index, but there is a problem that the red phosphor absorbs the wavelength of the green region and the light flux is lowered.

Accordingly, it is required to develop a phosphor composition capable of improving the color rendering index and increasing the light flux and a light emitting device package including the same.

DISCLOSURE

Technical Problem

Embodiments provide a phosphor composition capable of simultaneously improving a color rendering index and a luminous flux, a light emitting device package including the same, and a lighting apparatus.

Technical Solution

The phosphor composition according to an embodiment includes a first phosphor that is excited by an excitation light source and emits light in a first wavelength range; a second phosphor excited by the excitation light source to emit light in a second wavelength range; and a third phosphor that is excited by the excitation light source and emits light in a third wavelength range, wherein the first wavelength range, the second wavelength range, and the third wavelength range are different from each other.

A emission center wavelength of the first phosphor may be from 490 nm to 505 nm.

A emission center wavelength of the second phosphor may be from 515 nm to 570 nm.

The emission center wavelength of the third phosphor may be from 580 nm to 670 nm.

Another embodiment includes a body portion; a first electrode portion and a second electrode portion disposed on the body portion; a light emitting device disposed on the body portion and electrically connected to the first electrode portion and the second electrode portion; and a molding part disposed around the light emitting device and including the phosphor composition.

Still another embodiment provides a lighting apparatus including the above-described light emitting device package as a light source.

Advantageous Effects

The phosphor composition according to the embodiment and the light emitting device package and the lighting device including the same can improve the color rendering index as the intensity of the light in the cyan wavelength region emitted from the phosphor composition increases and as the color width of the light in the red wavelength range becomes shorter, the light flux can be improved.

MODE FOR INVENTION

Figure 1:
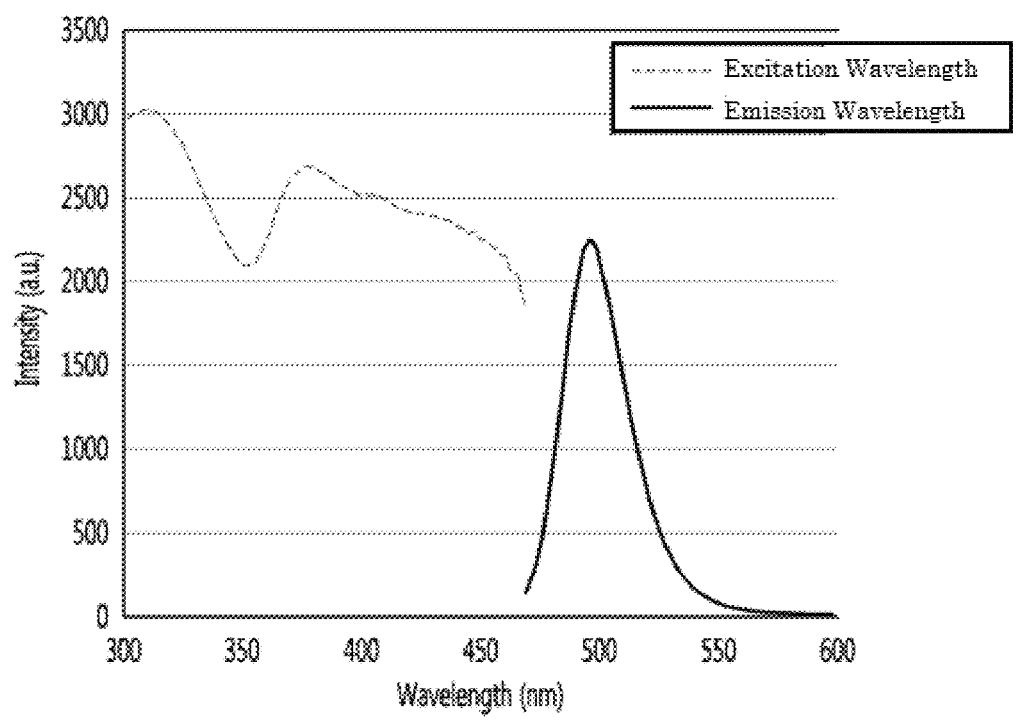
FIG. 1 is a view showing an emission wavelength and an excitation wavelength of the first phosphor.

Hereinafter, embodiments of the present invention capable of implementing the above objects will be described with reference to the accompanying drawings.

In the description of embodiments according to the present invention, in the case of being described as being formed "on or under" of each element, the upper or lower or under are all such that two elements are in direct contact with each other or one or more other elements are indirectly formed between the two elements. Also, when expressed as "on or under", it may include not only an upward direction but also a downward direction based on an element.

It is also to be understood that the terms "first" and "second", "on/upper/above" and "low/lower/under" may be used solely to distinguish one entity or element from another entity or element, without necessarily requiring or implying any physical or logical relation or sequences.

The thickness and size of each layer in the drawings can be exaggerated, omitted, or schematically shown for convenience and clarity of explanation. Also, the size of each component does not entirely reflect the actual size.

The phosphor composition according to an embodiment includes a first phosphor that is excited by an excitation light source having an ultraviolet or blue wavelength and emits light in a first wavelength range; a second phosphor excited by the excitation light source to emit light in a second wavelength range; and a third phosphor that is excited by the excitation light source and emits light in a third wavelength range.

The excitation light source of the blue wavelength may have a peak wavelength of 400 nm or more at the excitation wavelength. For example, the excitation light source of the blue wavelength may have a peak wavelength of 400 nm to 470 nm as the excitation wavelength.

In this case, the first wavelength region, the second wavelength region, and the third wavelength region may be different regions. In detail, the first wavelength region, the second wavelength region, and the third wavelength region may emit different colors as they have peak wavelengths in different regions.

By the excitation light source, the first phosphor may emit cyan light of the first wavelength range. That is, the first phosphor may be a blue-green phosphor.

By the excitation light source, the second phosphor may emit green light of the second wavelength region. That is, the second phosphor may be a green phosphor.

By the excitation light source, the third phosphor may emit red light of the third wavelength range. That is, the third phosphor may be a red phosphor.

The first phosphor may be a nitrile-based blue-green phosphor. The first phosphor may include $Eu^{2+}$ as an active ion, the $Eu^{2+}$ absorbs near-ultraviolet or blue light generated from the LED, and a cyan Light can be generated with the nitride phosphor used as a matrix.

For example, the first phosphor may be an oxynitrides blue-green phosphor. The first phosphor includes $Eu^{2+}$ as an active ion, and the $Eu^{2+}$ ion absorbs near ultraviolet or blue light generated from the LED, and the cyan Light can be generated with the nitride phosphor used as a matrix.

The first phosphor may be a silicate blue-green phosphor. The first phosphor includes $Eu2^+$ as an active ion, and the $Eu^{2+}$ ion absorbs near ultraviolet or blue light generated from the LED, and the cyan Light can be generated with the nitride phosphor used as a matrix.

The first phosphor may include one of $(Ba, Mg)_{3-a}Si_{6-b}O_{3.5-c}N_{8.5-d}(Li, Cl, F, P)_{1-e}:Eu^{2+}{}_a$, $(Ba, Mg, Ca, Sr)_{3-a}Si_6O_3N_8:Eu^{2+}{}_a$ and $(Ba, Mg, Ca, Sr)_{1-a}Si_2O_2N_2:Eu^{2+}{}_a$. For example, the first phosphor may be one of represented by the formula $(Ba, Mg)_{3-a}Si_{6-b}O_{3.5-c}N_{8.5-d}(Li, Cl, F, P)_{1-e}:Eu^{2+}{}_a$, $(Ba, Mg, Ca, Sr)_{3-a}Si_6O_3N_8:Eu^{2+}{}_a$ and $(Ba, Mg, Ca, Sr)_{1-a}Si_2O_2N_2:Eu^{2+}{}_a$.

Here, different metals included in the parentheses ( ) may mean that one or more kinds of metals may be included. In $(Ba, Mg)_{3-a}Si_{6-b}O_{3.5-c}N_{8.5-d}(Li, Cl, F, P)_{1-e}:Eu^{2+}{}_a$ (Ba, Mg) may mean that at least one of Ba or Mg is included and (Li, Cl, F, P) may mean that at least one of Li, Cl, F and P is included.

In $(Ba, Mg, Ca, Sr)_{3-a}Si_6O_3N_8:Eu^{2+}{}_a$ (Ba, Mg, Ca, Sr) may mean that at least one of Ba, Mg, Ca and Sr is included. In $(Ba, Mg, Ca, Sr)_{1-a}Si_2O_2N_2:Eu^{2+}{}_a$, (Ba, Mg, Ca, Sr) may mean that at least one of Ba, Mg, Ca and Sr can be contained.

More specifically, the first phosphor is represented by the formula $(Ba, Mg)_{3-a}Si_{6-b}O_{3.5-c}N_{8.5-d}(Li, Cl, F, P)_{1-e}:Eu^{2+}{}_a$, where a, b, c, d and e may have a range of $0.01 \leq a \leq 0.30$, $0.01 \leq b \leq 1.0$, $0.01 \leq c \leq 0.5$, $0.01 \leq d \leq 0.5$, $0.01 \leq e \leq 0.9$ respectively. Alternatively, the first phosphor may be represented by the formula $(Ba, Mg, Ca, Sr)_{3-a}Si_6O_3N_8:Eu^{2+}{}_a$, where a ranges from 0.01 to 0.30. Alternatively, the first phosphor may be represented by the formula $(Ba, Mg, Ca, Sr)_{1-a}Si_2O_2N_2:Eu^{2+}{}_a$, where a ranges from 0.01 to 0.30.

The second phosphor may be an aluminate green phosphor and/or a nitrides green phosphor. The second phosphor includes $Ce^{3+}$ as an active ion, and the $Ce^{3+}$ ion absorbs near ultraviolet or blue light generated from the LED, and Green light can be generated with the aluminate- and/or nitride-phosphor as a matrix.

The second phosphor may be represented by the formula $(Lu, Y, Gd)_{3-x}(Al, Ga)_5O_{12}:Ce^{3+}{}_x$, $(Y, Lu, Gd)_{3-x}(Al, Ga)_5O_{12}:Ce^{3+}{}_x$ and $La_{3-x}Si_6N_{11}:Ce^{3+}{}_x$. For example, the second phosphor may be represented by the formula $(Lu, Y, Gd)_{3-x}(Al, Ga)_5O_{12}:Ce^{3+}{}_x$, $(Y, Lu, Gd)_{3-x}(Al, Ga)_5O_{12}:Ce^{3+}{}_x$ and $La_{3-x}Si_6N_{11}:Ce^{3+}{}_x$. Here, $(Lu, Y, Gd)_{3-x}(Al, Ga)_5O_{12}:Ce^{3+}{}_x$ and $(Y, Lu, Gd)_{3-x}(Al, Ga)_5O_{12}:Ce^{3+}{}_x$ may mean that the compositions of the metal elements contained in the parentheses are different.

In detail, (Lu, Y, Gd) in LuAG series phosphors represented by $(Lu, Y, Gd)_{3-x}(Al, Ga)_5O_{12}:Ce^{3+}{}_x$ means that at least one of Lu, Y, Gd is included. And (Al, Ga) means that at least one of Al and Ga is included.

In the YAG series fluorescent material (G-YAG or Ga-YAG) represented as $(Y, Lu, Gd)_{3-x}(Al, Ga)_5O_{12}:Ce^{3+}{}_x$ (Y, Lu, Gd) means that at least one of Y, Lu and Gd is contained, and (Al, Ga) means that at least one of Al and Ga is included.

More specifically, the second phosphor may be represented by the formula $(Lu, Y, Gd)_{3-x}(Al, Ga)_5O_{12}:Ce^{3+}{}_x$, where the range of x is $0.01 \leq x \leq 0.5$. Alternatively, the second phosphor may be represented by the formula $(Y, Lu, Gd)_{3-x}(Al, Ga)_5O_{12}:Ce^{3+}{}_x$, where the range of x may be $0.01 \leq x \leq 0.5 \leq x \leq 0.01 \leq x \leq 0.5$. Alternatively, the second phosphor may be represented by the formula $La_{3-x}Si_6N_{11}:Ce^{3+}{}_x$, wherein the range of x may be $0.01 \leq x \leq 0.5 \leq x \leq 0.01 \leq x \leq 0.5$.

The third phosphor may include nitrides based red phosphors and/or silicates based red phosphors. The third phosphor may include $Eu^{2+}$ as an active ion, and the $Eu^{2+}$ ion absorbs near ultraviolet light or blue light generated from the LED, and the nitride phosphor is used as a matrix to emit red light. Alternatively, the third phosphor may include $Mn^{4+}$ as an active ion, and the $Mn^{4+}$ ion absorbs near ultraviolet or blue light generated from the LED, and the silicate phosphor is used as a matrix to emit red light.

The third phosphor may be any one nitride based red phosphor represented by the formula $(Ca, Sr)_{1-x}AlSiN_3:Eu^{2+}_x$, $(Ca)_{1-x}AlSiN_3:Eu^{2+}_x$, $Sr_{2-x}Si_5N_8:Eu^{2+}_x$ and $(Ba, Sr)_{2-x}Si_5N_8:Eu^{2+}_x$. For example, the third phosphor may be any one represented by the formula $(Ca, Sr)_{1-x}AlSiN_3:Eu^{2+}_x$, $(Ca)_{1-x}AlSiN_3:Eu^{2+}_x$, $Sr_{2-x}Si_5N_8:Eu^{2+}_x$ and $(Ba, Sr)_{2-x}Si_5N_8:Eu^{2+}_x$.

The third phosphor may include a KSF series $K_2Si_{1-x}F_6:Mn^{4+}_x$, which is a silicate red phosphor.

The third phosphor may include different kinds of red phosphors. That is, the third phosphor may include both a nitride red phosphor and a silicate red phosphor. For example, the third phosphor may be represented by the formula $(Ca, Sr)_{1-x}AlSiN_3:Eu^{2+}_x$, $(Ca)_{1-x}AlSiN_3:Eu^{2+}_x$, $Sr_{2-x}Si_5N_8:Eu^{2+}_x$ and $(Ba, Sr)_{2-x}Si_5N_8:Eu^{2+}_x$ and a silicate red phosphor of the formula $K_2Si_{1-x}F_6:Mn^{4+}_x$.

Here, different metals included in the parentheses ( ) may mean that one or more kinds of metals may be included. In detail, $(Ca, Sr)_{1-x}AlSiN_3:Eu^{2+}_x$, $(Ca, Sr)$ may mean that at least one of Ca and Sr is included. In $(Ba, Sr)_{2-x}Si_5N_8:Eu^{2+}_x$, $(Ba, Sr)$ may mean that at least one of Ba and Sr is included.

More specifically, the third phosphor may be represented by the formula $(Ca, Sr)_{1-x}AlSiN_3:Eu^{2+}_x$, wherein the range of x may be $0.01 \leq x \leq 0.5 \leq x \leq 0.01 \leq x \leq 0.5$. Alternatively, the third phosphor may be represented by the formula $(Ca)_{1-x}AlSiN_3:Eu^{2+}_x$ wherein the range of x may be $0.01 \leq x \leq 0.5 \leq x \leq 0.01 \leq x \leq 0.5$. Alternatively, the third phosphor may be represented by the formula $Sr_{2-x}Si_5N_8:Eu^{2+}_x$, wherein the range of x may be $\leq x \leq 0.01 \leq x \leq 0.5$. Alternatively, the third phosphor may be represented by the formula $(Ba, Sr)_{2-x}Si_5N_8:Eu^{2+}_x$, wherein the range of x may be $0.01 \leq x \leq 0.5$. Alternatively, the third phosphor may be represented by the formula $K_2Si_{1-x}F_6:Mn^{4+}_x$, wherein the range of x may be $0.01 \leq x \leq 0.3$.

Hereinafter, the wavelength characteristics of the first phosphor and the third phosphor will be described in detail with reference to FIGS. 1 and 2. FIG.

FIG. 1 is a diagram showing the emission wavelength and the excitation wavelength of the blue phosphor which is the first phosphor.

Referring to FIG. 1, the excitation wavelength of the first phosphor may include blue light of 350 nm to 450 nm.

The central wavelength of the first phosphor may emit a peak wavelength of 490 nm to 505 nm. That is, the maximum emission peak of the first phosphor may be 495 nm to 500 nm. For example, the maximum emission peak of the first phosphor may be about 498 nm. Here, "about" may represent a range of around several nanometers.

The full width at half maximum (FWHM) of the peak wavelength of the first phosphor may be 35 nm or less. For example, the full width at half maximum (FWHM) of the peak wavelength of the first phosphor may be 30 nm to 35 nm. For example, the full width at half maximum (FWHM) of the peak wavelength of the first phosphor may be about 32 nm.

Although not shown in the drawing, the central wavelength of the second phosphor may emit a peak wavelength of 515 nm to 570 nm. That is, the maximum emission peak of the second phosphor may be 515 nm to 570 nm. For example, the maximum emission peak of the second phosphor may be about 539 nm to about 541 nm. Here, "about" may represent a range of around several nanometers.

The full width at half maximum (FWHM) of the peak wavelength of the second phosphor may be 110 nm or less. For example, the full width at half maximum (FWHM) of the peak wavelength of the second phosphor may be 100 nm to 110 nm. For example, the full width at half maximum (FWHM) of the peak wavelength of the second phosphor may be about 106 nm.

Figure 2:
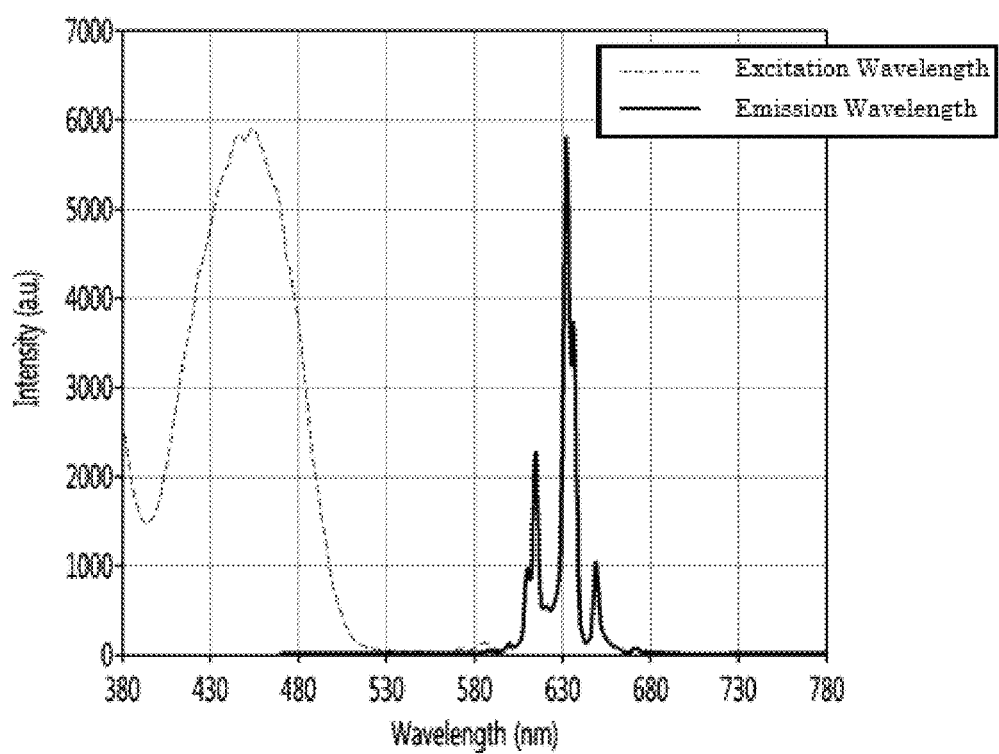
FIG. 2 is a diagram showing an emission wavelength and an excitation wavelength of a silicate-red phosphor among the third phosphors.

FIG. 2 is a graph showing the wavelength and intensity of the silicate-based red phosphor. In detail, FIG. 2 is a graph showing the wavelength and intensity of the chemical formula $K_2Si_{1-x}F_6:Mn^{4+}_x$.

Referring to FIG. 2, the excitation wavelength of the third phosphor as the silicate-based red phosphor may include blue light of 400 nm to 480 nm.

The center wavelength of the third phosphor as the silicate red phosphor may emit a peak wavelength of 580 nm to 670 nm. That is, the maximum emission peak of the third phosphor may be 580 nm to 670 nm. For example, the maximum emission peak of the third phosphor may be about 632 nm. Here, "about" may represent a range of around several nanometers.

The full width at half maximum (FWHM) of the third phosphor of the silicate-based red phosphor may be 10 nm or less. For example, the full width at half maximum (FWHM) of the peak wavelength of the third phosphor may be 5 nm to 10 nm. For example, the full width at half maximum (FWHM) of the peak wavelength of the third phosphor may be about 7 nm.

Meanwhile, although not shown in the figure, the center wavelength of the third phosphor, which is the nitride red phosphor, can emit a peak wavelength of 580 nm to 670 nm. That is, the maximum emission peak of the third phosphor may be 580 nm to 670 nm. For example, the maximum emission peak of the third phosphor may be about 610 nm to about 625 nm. For example, the maximum emission peak of the third phosphor may be about 610 nm to 624 nm. Here, "about" may represent a range of around several nanometers.

The full width at half maximum (FWHM) of the third phosphor as the nitride red phosphor may be 85 nm or less. For example, the full width at half maximum (FWHM) of the peak wavelength of the third phosphor may be 70 nm to 80 nm. For example, the full width at half maximum (FWHM) of the third phosphor may be about 76 nm to about 79 nm.

The first phosphor, the second phosphor, and the third phosphor may have a particle size corresponding to or different from each other.

For example, the average particle diameter (D50) of the first phosphor may be 15 to 20 μm. For example, the average particle diameter (D50) of the first phosphor may be about 16 μm to about 17 μm. For example, the average particle diameter (D50) of the first phosphor may be about 16.9 μm. Here, "about" may indicate a range of about several micrometers.

For example, the average particle size (D50) of the second phosphor may be 10 μm to 15 μm. For example, the average particle diameter (D50) of the second phosphor may be about 12.3 μm to about 13.4 μm. Here, "about" may indicate a range of about several micrometers.

The third phosphor may have different sizes of the nitride red phosphor and the silicate red phosphor. In detail, the silicate-based red phosphor may be larger in size than the nitride based red phosphor.

For example, the average particle diameter (D50) of the third phosphor as the nitride red phosphor may be 8 to 12 μm. For example, the average particle size (D50) of the third phosphor as the nitride based red phosphor may be about 9.7 to about 11.9 μm. Here, "about" may indicate a range of about several micrometers.

For example, the average particle size (D50) of the third phosphor as the silicate-based red phosphor may be 25 μm to 30 μm. For example, the average particle size (D50) of the second phosphor as the silicate-based red phosphor may be about 26 μm to about 27 μm. For example, the average particle diameter (D50) of the second phosphor as the silicate-based red phosphor may be about 26.8 μm. Here, "about" may indicate a range of about several micrometers.

Figure 3A:
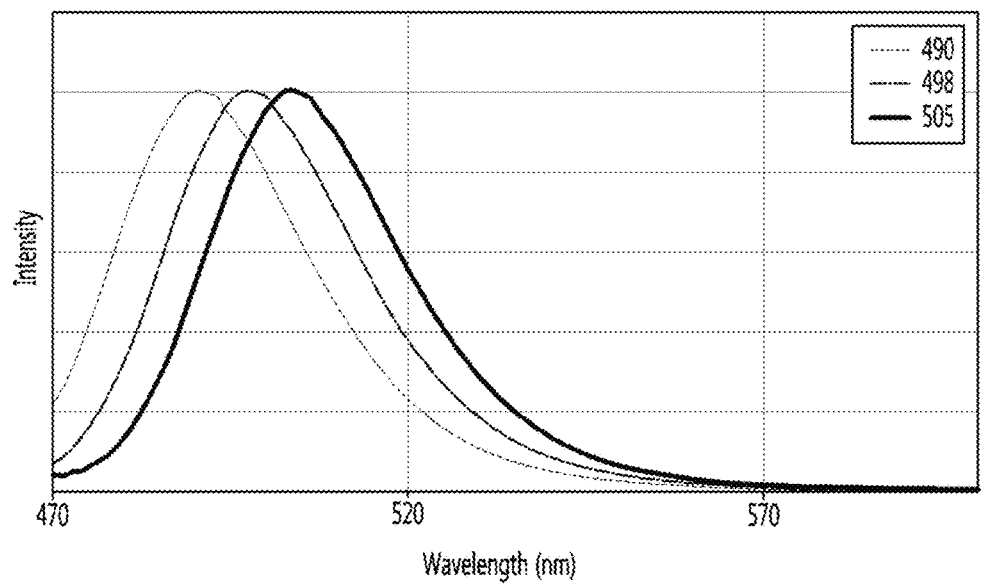
FIGS. 3A to 3C are graphs showing the intensity of light according to the wavelengths of the first phosphor, the second phosphor and the third phosphor included in the phosphor composition.
Figure 3B:
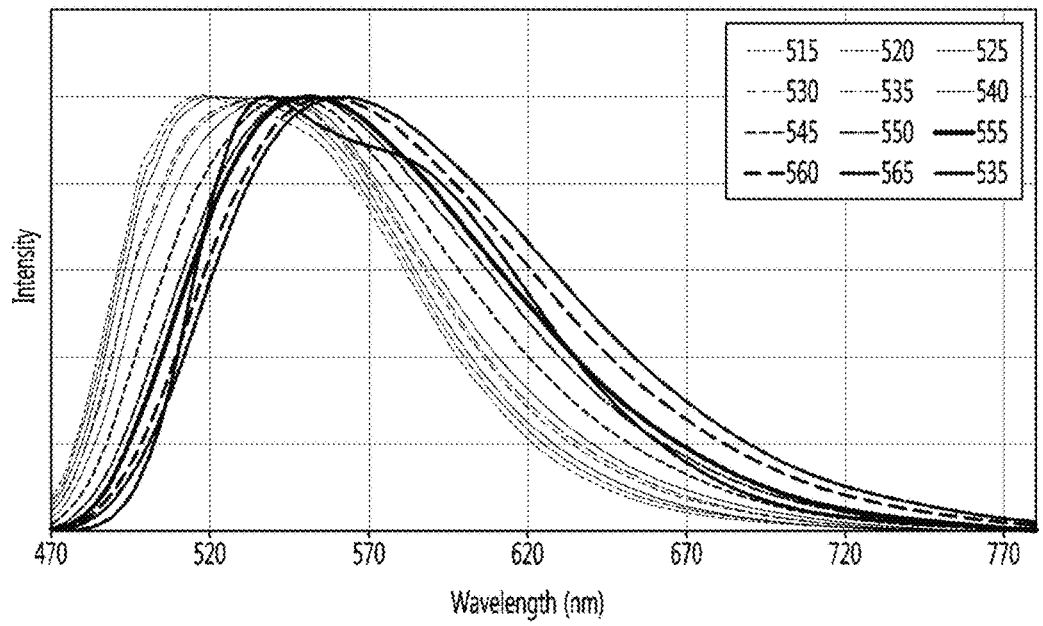
Figure 3C:
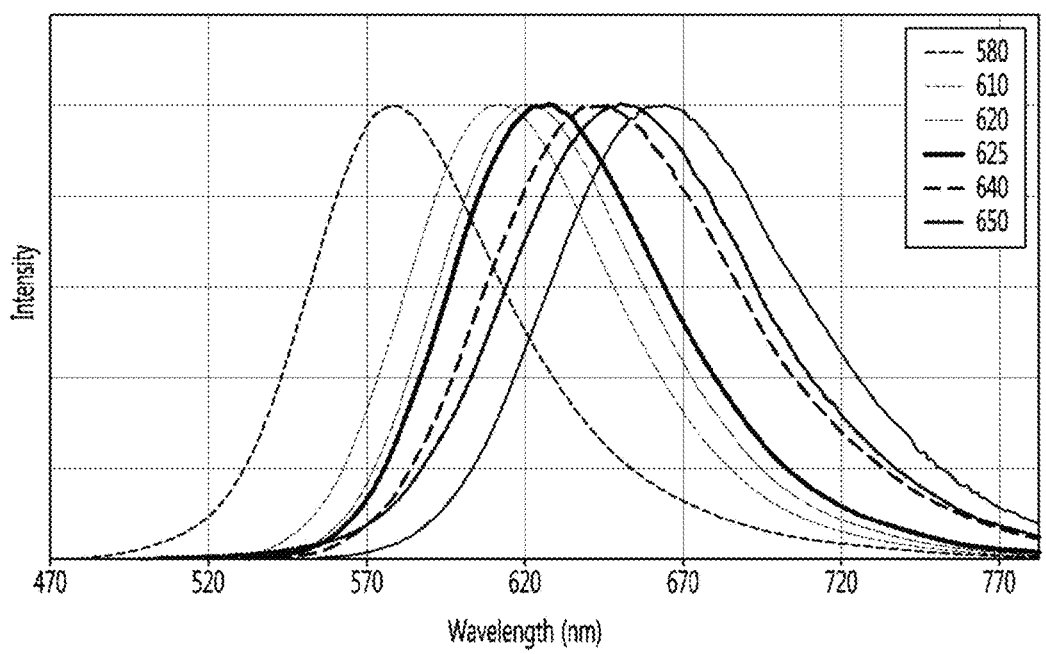

FIGS. 3A to 3C are graphs showing the intensities of light according to the wavelengths of the blue-green phosphor, the green phosphor and the red phosphor contained in the phosphor composition.

In FIG. 3A, the emission center wavelength of the first phosphor emits light in the cyan wavelength range from 490 nm to 505 nm, the emission center wavelength of the second phosphor in FIG. 3B emits light in the green wavelength range from 515 nm to 570 nm, In FIG. 3C, the emission center wavelength of the third phosphor emits light in the red wavelength range from 580 nm to 670 nm. As the composition of the first to third phosphors varies, the wavelength range and intensity of emitted light also vary.

Hereinafter, a light emitting device package having the phosphor composition including the first phosphor, the second phosphor and the third phosphor will be described with reference to FIGS. 4 to 6.

Figure 4:
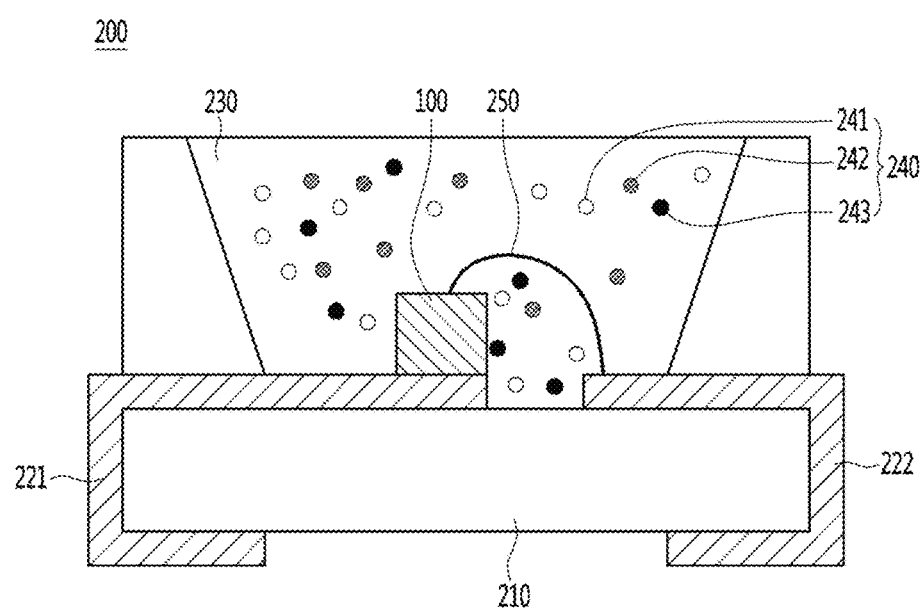
FIG. 4 is a cross-sectional view of a light emitting device package including a phosphor composition according to an embodiment.

Referring to FIG. 4, the light emitting device package 200 according to the embodiment may include a body 210, a cavity formed on the body 210, and a light emitting device 100 disposed in the cavity. The LED chip 210 may include lead frames 221 and 222 for electrical connection with the light emitting device 100.

The light emitting device 100 may be disposed on the bottom surface of the cavity in the cavity, and the molding part 230 may be disposed on the cavity surrounding the light emitting device 100.

The molding part 230 may include the phosphor composition of the above-described embodiments.

The body 210 may include a silicone material, a synthetic resin material, or a metal material. The body 210 may have a cavity having an open top and side and bottom surfaces.

The cavity may be formed in a cup shape, a concave container shape or the like, and the side surface of the cavity may be formed perpendicular or inclined with respect to the bottom surface, and may vary in size and shape.

The shape of the cavity viewed from the top may be circular, polygonal, elliptical, or the like, and may be curved at an edge, but is not limited thereto.

The body 210 may include a first lead frame 221 and a second lead frame 222 and may be electrically connected to the light emitting device 100. When the body part 210 is made of a conductive material such as a metal material, although not shown, an insulating layer is coated on the surface of the body part 210 to prevent an electrical short between the first and second lead frames 221 and 222.

The first lead frame 221 and the second lead frame 222 are electrically separated from each other and can supply a current to the light emitting device 100. The first lead frame 221 and the second lead frame 222 may reflect the light generated by the light emitting device 100 to increase the light efficiency and discharge the heat generated in the light emitting device 100 to the outside.

The light emitting device 100 may be disposed in the cavity and may be disposed on the body 210 or on the first lead frame 221 or the second lead frame 222. The light emitting device 100 disposed in the cavity may be a vertical light emitting device, a horizontal light emitting device, or the like.

Referring to FIG. 4, the light emitting device 100 may be disposed on the first lead frame 221 and the second lead frame 222 may be connected to the light emitting device 100 through the wire 250. However, the light emitting device 100 may be connected to the lead frame by a flip chip bonding or a die bonding method in addition to the wire bonding method.

Referring to FIG. 4, the molding part 230 of the light emitting device package 200 may fill the cavity. The molding part 230 may be formed in the cavity on the body 210 and the lead frames 221 and 222. The molding part 230 may cover the upper surface and the side surface of the light emitting device 100 as a whole. Accordingly, the molding part 230 can protect the light emitting device 100.

In addition, the molding part 230 may be formed to include the phosphor composition and the resin of the embodiment including the plurality of phosphors 240. In detail, the molding part 230 may include a phosphor composition including the first phosphor 241, the second phosphor 242, and the third phosphor 243 and a resin.

The molding part 230 may include a resin and the first fluorescent material 241, the second fluorescent material 242 and the third fluorescent material 243. The molding part 230 may be disposed to surround the light emitting device 100. That is, the molding part 230 may include the resin and the first fluorescent material 241, the second fluorescent material 242, and the third fluorescent material 243, and the molding part 230 can be disposed in the cavity and can surround the light emitting device 100.

The resin that can be mixed and used together with the phosphor composition in the molding part 230 may be any one of a silicone resin, an epoxy resin, and an acrylic resin or a mixture thereof.

Also, the first fluorescent material 241, the second fluorescent material 242, and the third fluorescent material 243 may be excited by the light emitted from the light emitting device 100 to emit the wavelength-converted light.

Although not shown in the drawing, the molding part 230 may be arranged in a dome shape that fills the cavity and is higher than the side height of the cavity, and may be deformed to adjust the light output angle of the light emitting device package 200 or may be arranged in a dome shape. The molding part may surround and protect the light emitting device 100 and function as a lens for changing a path of light emitted from the light emitting device 100.

Figure 5:
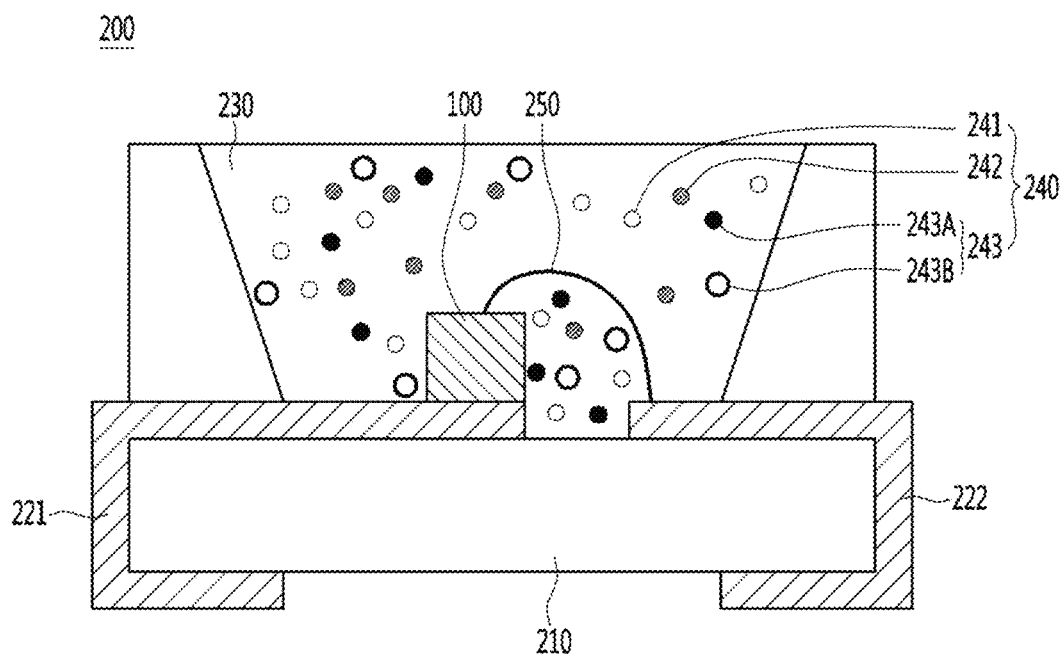
FIG. 5 is another cross-sectional view of a light emitting device package including a phosphor composition according to an embodiment.

Referring to FIG. 5, the molding part 230 may include a phosphor composition and a resin of an embodiment including a plurality of phosphors 240. In detail, the molding part 230 may include a phosphor composition including the first phosphor 241, the second phosphor 242, and the third phosphor 243 and a resin.

At this time, the third phosphor 243 may include both the nitride red phosphor 243A and the silicate red phosphor 243B having different diameters. In detail, the third fluorescent material 243 may include two kinds of red fluorescent materials having different compositions and different average particle diameters.

Figure 6:
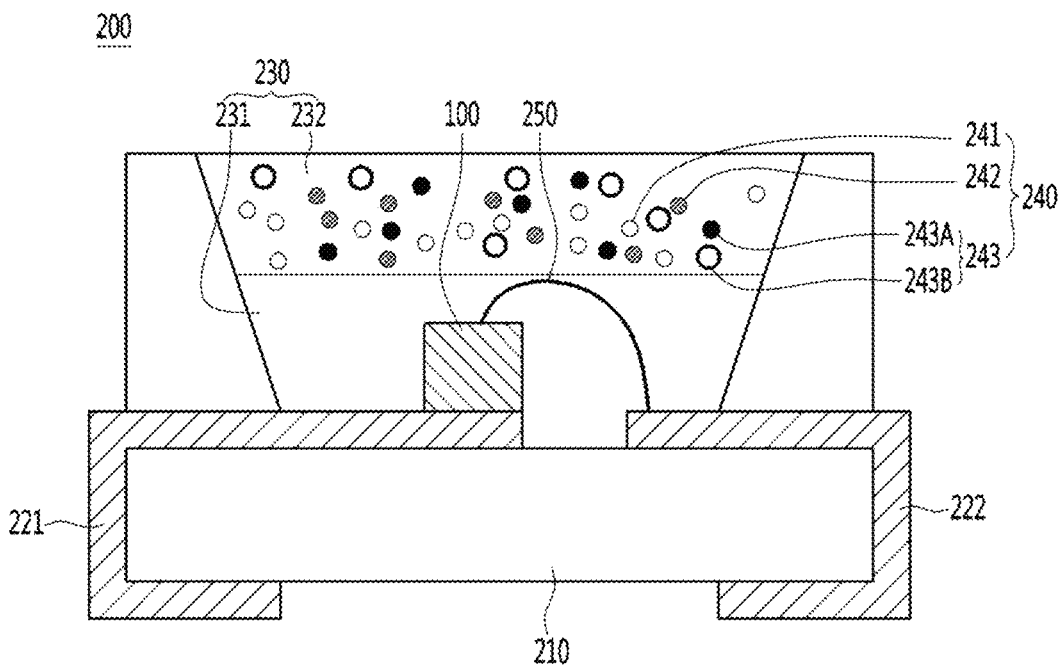
FIG. 6 is another cross-sectional view of a light emitting device package including the phosphor composition according to the embodiment.

Referring to FIG. 6, the molding part 230 may include a plurality of molding parts 231 and 232. The molding part 230 may include a first molding part 231 and a second molding part 232. For example, the first molding part 231 may surround the light emitting device 100, and the second molding part 232 may be disposed on the first molding part 231.

The phosphor composition according to an embodiment may be disposed on any one of the first molding part 231 and the second molding part 232.

For example, the first fluorescent material 241, the second fluorescent material 242, and the third fluorescent material 243 may be disposed in the second molding part 232.

The ratio of the thickness of the first molding part 231 and the thickness of the second molding part 232 may be in the range of 2:1 to 1:3. If the thickness ratio of the second molding part 232 is smaller than the above range, the ability to disperse the transmitted heat may be deteriorated. If the thickness ratio is larger than the above range, the thickness of the light emitting device package may increase.

The first fluorescent material 241, the second fluorescent material 242, and the third fluorescent material 243 may be spaced apart from the light emitting device 100. In detail, the first phosphor 241, the second phosphor 242, and the third phosphor 243 may be disposed in the cavity away from the light emitting device 100.

The second molding part 232 may have a distance of 0.2 mm or more from the light emitting device 100. If the spacing distance is smaller than 0.2 mm, a problem may occur due to deterioration of the phosphor composition.

Figure 7:
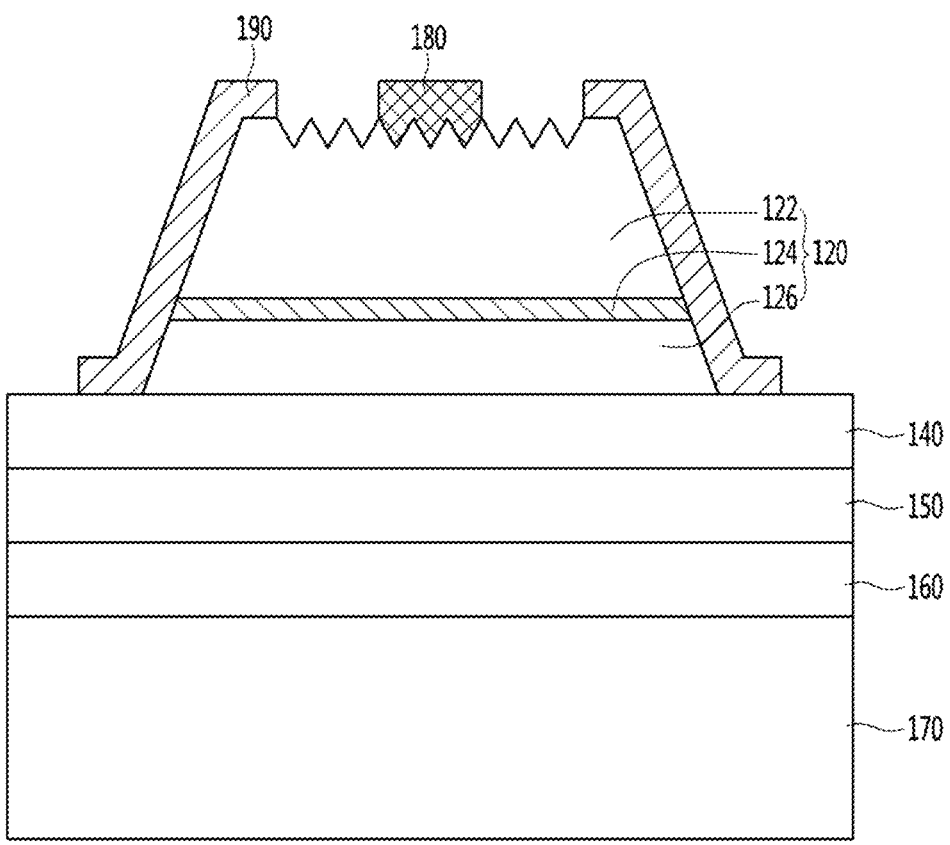
FIG. 7 is a cross-sectional view of the light emitting device in the light emitting device package.

FIG. 7 illustrates an embodiment of a light emitting device 100. The light emitting device 100 includes a support substrate 170, a light emitting structure 120, an ohmic layer 140, and a first electrode 180.

The light emitting structure 120 includes a first conductive semiconductor layer 122, an active layer 124, and a second conductive semiconductor layer 126.

The first conductive semiconductor layer 122 may be formed of a compound semiconductor such as a Group III-V or a Group II-VI, and may be doped with a first conductive dopant. The first conductive semiconductor layer 122 is a semiconductor material having a composition formula of $Al_xIn_yGa_{(1-x-y)}N (0 \le x \le 1, 0 \le y \le 1, 0 \le x+y \le 1)$, such as one of AlGaN, GaN, InAlGaN, AlGaAs, GaP, GaAs, GaAsP, and AlGaInP.

When the first conductivity type semiconductor layer 122 is an n-type semiconductor layer, the first conductivity type dopant may include n-type dopants such as Si, Ge, Sn, Se, and Te. The first conductive semiconductor layer 122 may be formed as a single layer or a multilayer, but the present invention is not limited thereto.

The active layer 124 is disposed between the first conductive semiconductor layer 122 and the second conductive semiconductor layer 126 and includes a single well structure, a multiple well structure, a single quantum well structure, a multi quantum well (MQW) well structure, a quantum dot structure, or a quantum wire structure.

The active layer 124 may include a pair structure including a well layer and a barrier layer, for example one of AlGaN/AlGaN, InGaN/GaN, InGaN/InGaN, AlGaN/GaN, InAlGaN/GaN, GaAs(InGaAs)/AlGaAs, GaP(InGaP)/AlGaP, but is not limited thereto. The well layer may be formed of a material having an energy band gap smaller than the energy band gap of the barrier layer.

The second conductive semiconductor layer 126 may be formed of a semiconductor compound. The second conductive semiconductor layer 126 may be formed of a compound semiconductor such as a Group III-V or a Group II-VI, and may be doped with a second conductive dopant. The second conductive semiconductor layer 126 may be a semiconductor material having a composition formula of $In_xAl_yGa_{1-x-y}N$ $(0 \le x \le 1, 0 \le y \le 1, 0 \le x+y \le 1)$, such as one of AlGaN, GaN, AlInN, AlGaN, GaP, GaAs, GaAsP, AlGaInP. For example, the second conductivity type semiconductor layer 126 may be made of $Al_xGa_{(1-x)}N$. When the second conductive semiconductor layer 126 is a p-type semiconductor layer, the second conductive dopant may be a p-type dopant such as Mg, Zn, Ca, Sr, or Ba. The second conductive semiconductor layer 126 may be formed as a single layer or a multilayer, but the present invention is not limited thereto.

The surface of the first conductivity type semiconductor layer 122 forms a pattern, and the light extraction efficiency can be improved. The first electrode 180 may be disposed on the surface of the first conductive semiconductor layer 122 and may be disposed on the surface of the first conductive semiconductor layer 122 on which the first electrode 180 is disposed, may not form a pattern. The first electrode 180 may be formed as a single layer or a multilayer structure including at least one of aluminum (Al), titanium (Ti), chromium (Cr), nickel (Ni), copper (Cu) have.

A passivation layer 190 may be formed around the light emitting structure 120. The passivation layer 190 may be made of an insulating material, and the insulating material may be made of a non-conductive oxide or nitride. For example, the passivation layer 190 may comprise a silicon oxide ($SiO_2$) layer, an oxynitride layer, and an aluminum oxide layer.

A second electrode may be disposed under the light emitting structure 120, and the ohmic layer 140 and the reflective layer 150 may serve as a second electrode. GaN may be disposed under the second conductive type semiconductor layer 126 so that current or holes can be smoothly supplied to the second conductive type semiconductor layer 126.

The ohmic layer 140 may have a thickness of about 200 Angstroms (Å). The ohmic layer 140 may be formed of at least one of indium tin oxide (ITO), indium zinc oxide (IZO), indium zinc oxide (IZTO), indium aluminum zinc oxide (IAZO), indium gallium zinc oxide (IGZO), indium gallium tin oxide), AZO (aluminum zinc oxide), ATO (antimony tin oxide), GZO (gallium zinc oxide), IZON (IZO nitride), AGZO (Al—Ga ZnO), IGZO, NiO, RuOx/ITO, Ni/IrOx/Au, and Ni/IrOx/Au/ITO, Ag, Ni, Cr, Ti, Al, Rh, Pd, Ir, Sn, In, Ru, Au, and Hf, and the present invention is not limited to these materials.

The reflective layer 150 may be formed of a metal such as molybdenum (Mo), aluminum (Al), silver (Ag), nickel (Ni), platinum (Pt), rhodium (Rh) or alloy metal layer including Al or Ag, Pt or Rh. The reflective layer 150 effectively reflects the light generated in the active layer 124, thereby greatly improving the light extraction efficiency of the semiconductor device.

The support substrate 170 may be formed of a conductive material such as a metal or a semiconductor material. A metal having excellent electrical conductivity or thermal conductivity can be used, and a material having a high thermal conductivity (ex. Metal, etc.).

For example, a material selected from the group consisting of molybdenum (Mo), silicon (Si), tungsten (W), copper (Cu) and aluminum (Al) or alloy thereof, can be included in the support substrate 170 and also, an Au alloy or a copper alloy (Cu Alloy), a nickel (Ni), a copper-tungsten (Cu—W), a carrier wafer (for example, any one of GaN, Si, Ge, GaAs, ZnO, SiGe, SiC, SiGe, and the like) can be selected.

The support substrate 170 may have a thickness ranging from 50 to 200 μm so as to have a mechanical strength sufficient for separation into separate chips through a scribing process and a breaking process without causing warping of the entire nitride semiconductor.

The bonding layer 160 couples the reflective layer 150 and the support substrate 170 and may be formed of one of gold (Au), tin (Sn), indium (In), aluminum (Al), silicon (Si), silver (Ag), Nickel (Ni) and copper (Cu), or an alloy thereof.

The embodiment of the light emitting device 100 shown in FIG. 7 is an embodiment of the vertical light emitting device, but in the embodiment of the light emitting device package 200 shown in FIGS. 4 to 6, in addition to the vertical light emitting device shown in FIG. 7, a horizontal type light emitting device, and a flip chip type light emitting device can be disposed, in this case, the light emitting device 100 can emit light in a blue light wavelength range.

The light emitting device package according to one embodiment shown in FIGS. 4 to 6 including the light emitting device 100 shown in FIG. 7 may emit white light.

The light emitting device according to the embodiment is a white light emitting device, which is a white light emitting device having a warm white of 2500K to 4000K, a neutral white of 3000 to 4000K, and a cool white device of 6500K to 7000K can be implemented.

In the first embodiment of the phosphor composition, the second phosphor may be contained at a weight ratio of 15 wt % to 30 wt %, and the silicate third phosphor may be contained at a weight ratio of 85 wt % to 70 wt %. The second phosphor including LuAG represented by $(Lu, Y, Gd)_{3-x}(Al, Ga)_5O_{12}:Ce^{3+}_x$ and YAG represented by $(Y, Lu, Gd)_{3-x}(Al, Ga)_5O_{12}:Ce^{3+}_x$ has a weight ratio of 15 wt % to 30 wt %, and the third phosphor containing KSF represented by $K_2Si_{1-x}F_6:Mn^{4+}_x$ has a weight ratio of 15 wt % to 30 wt %, and the phosphor may be contained in the molding part of the light emitting device package in an amount of 65 wt % to 85 wt %.

Accordingly, the composition according to the embodiment can have a R9 value for measuring the color rendering property against strong red of more than 90, and can be utilized for illumination requiring a high color rendering index. At this time, the color temperature of the white LED may be about 4000K.

In the second embodiment of the phosphor composition, the first phosphor has a weight ratio of 1 wt % to 10 wt %, the second phosphor has a weight ratio of 35 wt % to 55 wt %, and the nitride based third phosphor has a weight ratio of 1 wt % to 10 wt % and the silicate-based third phosphor may be contained in a weight ratio of 40 wt % to 60 wt %.

The first phosphor has a weight ratio of 1 wt % to 10 wt %, the second phosphor including LuAG represented by $(Lu, Y, Gd)_{3-x}(Al, Ga)_5O_{12}:Ce^{3+}_x$ and YAG represented by $(Y, Lu, Gd)_{3-x}(Al, Ga)_5O_{12}:Ce^{3+}_x$ has a weight ratio of 15 wt % to 30 wt %, and the nitride based third phosphor has a weight ratio of 1 wt % to 10 wt %, the third phosphor containing KSF represented by $K_2Si_{1-x}F_6:Mn^{4+}_x$ has a weight ratio of 40 wt % to 60 wt %, and the phosphor may be contained in the molding part of the light emitting device package in an amount of 65 wt % to 85 wt %. Accordingly, the composition according to the embodiment can have a R9 value for measuring the color rendering property against strong red of more than 90, and can be utilized for illumination requiring a high color rendering index. At this time, the color temperature of the white LED may be about 4000K.

In the third embodiment of the phosphor composition, the second phosphor may be contained at a weight ratio of 25 wt % to 40 wt %, and the silicate third phosphor may be contained at a weight ratio of 60 wt % to 75 wt %.

In detail, m the second phosphor including LuAG represented by $(Lu, Y, Gd)_{3-x}(Al, Ga)_5O_{12}:Ce^{3+}_x$ and YAG represented by $(Y, Lu, Gd)_{3-x}(Al, Ga)_5O_{12}:Ce^{3+}_x$ has a weight ratio of 25 wt % to 40 wt %, and the third phosphor containing KSF represented by $K_2Si_{1-x}F_6:Mn^{4+}_x$ has a weight ratio of 60 wt % to 75 wt %, and the phosphor may be contained in the molding part of the light emitting device package in an amount of 55 wt % to 75 wt %.

Accordingly, the composition according to the embodiment can have a R9 value for measuring the color rendering property against strong red of more than 90, and can be utilized for illumination requiring a high color rendering index. At this time, the color temperature of the white LED may be about 5000K.

In the fourth embodiment of the phosphor composition, the first phosphor has a weight ratio of 1 wt % to 10 wt %, the second phosphor has a weight ratio of 35 wt % to 55 wt %, and the nitride based third phosphor has a weight ratio of 1 wt % to 10 wt %, and the silicate-based third phosphor may be contained in a weight ratio of 40 wt % to 60 wt %.

The first phosphor has a weight ratio of 1 wt % to 10 wt %, the second phosphor including LuAG represented by $(Lu, Y, Gd)_{3-x}(Al, Ga)_5O_{12}:Ce^{3+}_x$ and YAG represented by $(Y, Lu, Gd)_{3-x}(Al, Ga)_5O_{12}:Ce^{3+}_x$ has a weight ratio of 35 wt % to 55 wt %, and the nitride based third phosphor has a weight ratio of 1 wt % to 10 wt %, the third phosphor containing KSF represented by $K_2Si_{1-x}F_6:Mn^{4+}_x$ has a weight ratio of 40 wt % to 60 wt %, and the phosphor may be contained in the molding part of the light emitting device package in an amount of 65 wt % to 85 wt %.

Accordingly, the composition according to the embodiment can have a R9 value for measuring the color rendering property against strong red of more than 90, and can be utilized for illumination requiring a high color rendering index. At this time, the color temperature of the white LED may be about 5000K.

On the other hand, a color gamut is a region spanned between chromaticity points of the red, green, and blue pixels of the display in chromaticity, e.g., CIE 1931 x, y chromaticity diagram. The historical "golden standard" of the display is the NTSC gamut, which is limited to a set of three color coordinates. In general, a full range exceeding 70% of NTSC is considered acceptable for many backlighting applications, and a full range exceeding 90% of NTSC is considered acceptable for most of these optional uses.

The embodiment can improve the color reproducibility by providing the phosphor composition including the red peak wavelength of a long wavelength and a narrow half width, and can be 100% or more of the area ratio of the NTSC color gamut. Alternatively, it may be less than 100% of the area ratio of the NTSC color gamut depending on the combination of the phosphors.

That is, since the red color of the red phosphor according to the embodiment has a narrow half width and is distributed over a long wavelength, the color purity of red can be further widened, and the color reproduction rate in NTSC, in particular, a more realistic red color reproduction ratio can be obtained.

In addition, the phosphor compositions according to the first to fourth embodiments may include a red phosphor to improve the color rendering property. Since the silicate-based KSF phosphor that can be included at this time has a small half width, it is possible not to absorb the wavelength of the region, and the light flux can be improved.

Hereinafter, the present invention will be described in more detail with reference to examples and comparative examples. These embodiments are merely illustrative of the present invention in order to explain it in more detail. Therefore, the present invention is not limited to these embodiments.

Table 1 shows the characteristics of light emitted from the light emitting device package including the phosphor composition according to Comparative Examples 1 and 2 and Embodiment Example 1, respectively, when the color temperature of light emitted from the light emitting device package is 4000K (Kelvin).

TABLE 1

|  | Flux (lm) | Flux (%) | Cx | Cy | CCT (K) | CRI | R9 |
|---|---|---|---|---|---|---|---|
| Comparative Example 1 | 4.89 | 100 | 0.381 | 0.374 | 3970 | 84.7 | 14.7 |
| Comparative Example 2 | 4.43 | 90.7 | 0.381 | 0.374 | 3957 | 90.2 | 62.7 |
| Embodiment Example 1 | 4.79 | 98.2 | 0.382 | 0.377 | 3948 | 91.1 | 50.2 |

Comparative Example 1 includes a LuAG green phosphor and a $(Ca, Sr)_{1-x}AlSiN_3:Eu^{2+}{}_x$ red phosphor.

Comparative Example 2 includes a LuAG green phosphor and a KSF red phosphor.

Embodiment Example 1 includes the first phosphor, the LuAG green phosphor, the $(Ca, Sr)_{1-x}AlSiN_3:Eu^{2+}{}_x$ red phosphor and the KSF red phosphor that emit cyan light.

Comparative Example 1 and Comparative Example 2 include only a green phosphor and a red phosphor, and the types of red phosphors used are different.

KSF referenced by $K_2Si_{1-x}F_6:Mn^{4+}{}_x$ in Comparative Example 2, instead of $(Ca, Sr)_{1-x}AlSiN_3:Eu^{2+}{}_x$, which is a red phosphor used in Comparative Example 1, the color rendering index (CRI) was increased by 5.5 and the color rendering index (R9) of the red region was increased by 48.

The $(Ca, Sr)_{1-x}AlSiN_3:Eu^{2+}{}_x$ was used as the red phosphor in Comparative Example 1, but $(Ca, Sr)_{1-x}AlSiN_3:Eu^{2+}{}_x$ and $K_2Si_{1-x}F_6:Mn^{4+}{}_x$ were used as the red phosphor in Embodiment Example 1, thereby the color rendering index increased by 6.4 and the color rendering index of the red region increased by 35.5. As a result, it can be understood that the color rendering index (R9) of the color rendering index and the red color region can be improved by using KSF having a half width of 10 nm or less among the red phosphors.

Figure 8:
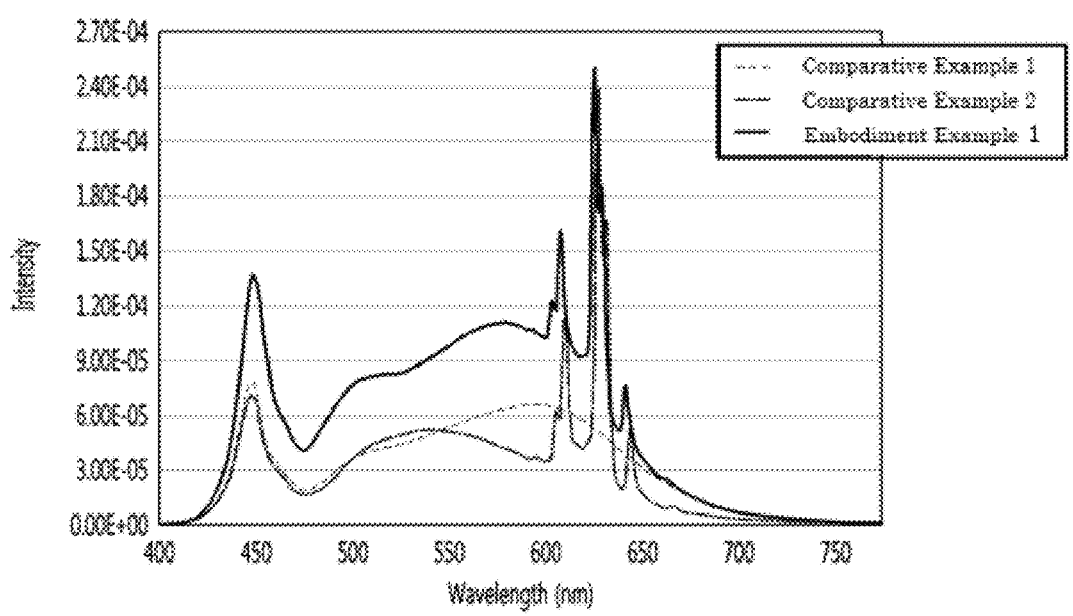
FIG. 8 is a graph showing the wavelength and intensity of the phosphor composition according to Comparative Examples 1 and 2 and Embodiment Example 1. FIG.

Referring to FIG. 8, in Comparative Example 1 and Comparative Example 2, only the green phosphor and the red phosphor were included, and thus the intensity according to the wavelength was low, but the intensity of the spectrum is high in Embodiment Example 1. In detail, as the weight ratio of the blue phosphor as the first phosphor increases, the intensity of the spectrum gradually increases in the region around 450 nm. It is also seen that the intensity of the spectrum decreases in the region around 480 nm. At this time, it can be seen that the spectral intensity of the embodiment example 1 is higher than that of the comparative example 1 and the comparative example 2 in the region before and after about 500 nm according to the inclusion of the blue-green phosphor, thereby improving the color rendering index. That is, the phosphor composition according to the embodiment may have a color rendering index of 90 or more. For example, the phosphor composition according to the embodiment may have a color rendering index of 91 or more at 4000K. In detail, the phosphor composition according to the embodiments may have a color rendering index of 490K to 91.1.

It is also seen that the intensity of the spectrum increases in the region around 630 nm. Since the half width of the wavelength observed in the region before and after about 630 nm is small in Embodiment Example 1 including KSF, it is possible to prevent the problem that the light flux is lowered as the red phosphor absorbs the wavelength of the green region.

Further, in Embodiment Example 1, since the color rendering index R9 of the red region has a value of 50 or more, it can be utilized for illumination having a high color rendering index. In detail, in Embodiment Example 1, the color rendering index (R9) of the red region may be 50.2.

That is, the embodiment improves the color rendering index, and the light flux can be improved as the wavelength of light in the red wavelength region becomes shorter.

Table 2 shows the characteristics of light emitted from the light emitting device package including the phosphor composition according to Comparative Examples 3, 4 and Embodiment Example 2 when the color temperature of the light emitted from the light emitting device package is 5000 K (Kelvin).

TABLE 2

|  | Flux (lm) | Flux (%) | Cx | Cy | CCT (K) | CRI | R9 |
|---|---|---|---|---|---|---|---|
| Comparative Example 3 | 4.88 | 100 | 0.346 | 0.353 | 4981 | 83.4 | 5.5 |
| Comparative Example 4 | 4.56 | 93.4 | 0.346 | 0.353 | 4989 | 93.1 | 87.8 |
| Embodiment Example 2 | 4.79 | 98.2 | 0.382 | 0.377 | 3948 | 91.1 | 50.2 |

Comparative Example 3 includes a LuAG green phosphor and a $(Ca, Sr)_{1-x}AlSiN_3:Eu^{2+}{}_x$ red phosphor.

Comparative Example 4 includes a LuAG green phosphor and a KSF red phosphor.

Embodiment Example 2 includes the first phosphor, the LuAG green phosphor, the $(Ca, Sr)_{1-x}AlSiN_3:Eu^{2+}{}_x$ red phosphor and the KSF red phosphor that emit cyan light.

Comparative Example 3 and Comparative Example 4 contain only a green phosphor and a red phosphor, and the types of red phosphors used are different.

Referring to the Table 2, KSF referenced by $K_2Si_{1-x}F_6:Mn^{4+}{}_x$ is used in Comparative Example 4, instead of $(Ca, Sr)_{1-x}AlSiN_3:Eu^{2+}{}_x$ which is a red phosphor used in Comparative Example 3, as a result, the color rendering index (CRI) increased by 9.7 and the color rendering index (R9) of the red region increased by 82.3.

$(Ca, Sr)_{1-x}AlSiN_3:Eu^{2+}{}_x$ was used as the red phosphor in Comparative Example 3, but $(Ca, Sr)_{1-x}AlSiN_3:Eu^{2+}{}_x$ and $K_2Si_{1-x}F_6:Mn^{4+}{}_x$ were used as the red phosphor, the color rendering index increased by 7.7 and the color rendering index of the red region increased by 44.7. As a result, it can be understood that the color rendering index (R9) of the color rendering index and the red color region can be improved by using KSF having a half width of 10 nm or less among the red phosphors.

Figure 9:
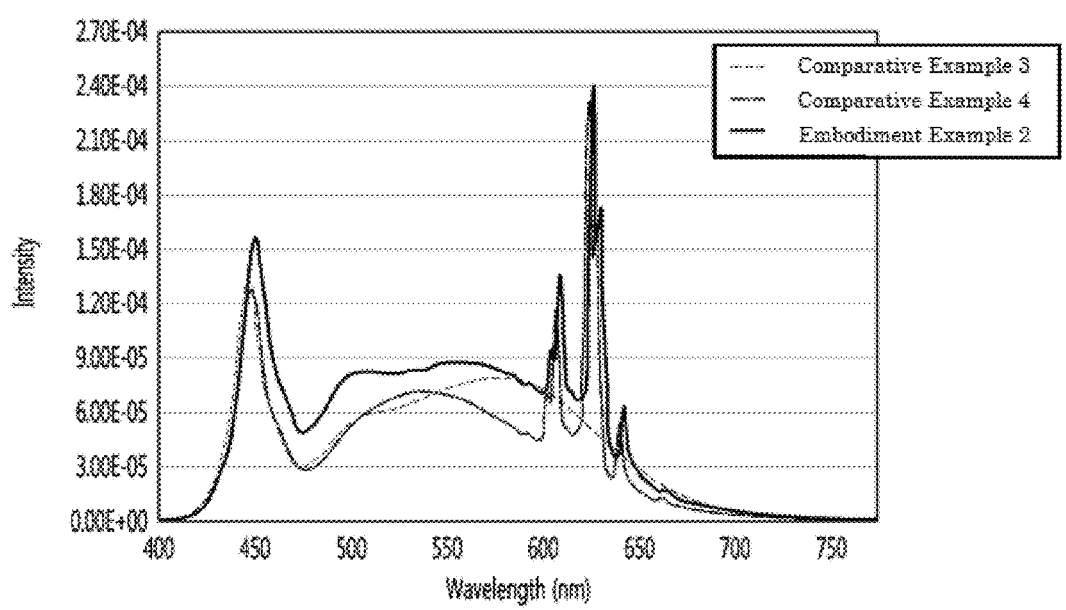
FIG. 9 is a graph showing the wavelength and intensity of the phosphor composition according to Comparative Examples 3, 4, and Embodiment Example 2.

Referring to FIG. 9, in Comparative Example 3 and Comparative Example 4, as only the green phosphor and the red phosphor were included, the intensity according to the wavelength was low. But in Embodiment Example 2, the spectral intensity according to the wavelength was large.

In detail, as the weight ratio of the blue phosphor as the first phosphor increases, the intensity of the spectrum gradually increases in the region around 450 nm. It is also seen that the intensity of the spectrum decreases in the region around 480 nm. It can be seen that the spectrum intensity of Embodiment Example 2 is higher than that of Comparative Example 3 and Comparative Example 4 in the region before and after about 500 nm according to the inclusion of the blue-green phosphor, thereby improving the color rendering index. That is, the phosphor composition according to the embodiment may have a color rendering index of 90 or more. For example, the phosphor composition according to the embodiment may have a color rendering index of 94 or more at 5000K. In detail, the phosphor composition according to the embodiment may have a color rendering index of 94.8 at 5000K.

It is also seen that the intensity of the spectrum increases in the region around 630 nm.

Since the half width of the wavelength observed in the region before and after about 630 nm is small in Embodiment Example 2 including KSF, the problem of light flux dropping due to the red phosphor absorbing the wavelength of the green region can be prevented.

In addition, since the color rendering index (R9) of the red region in Embodiment Example 2 is 70 or more, it can be utilized for illumination having a high color rendering index. In detail, in Embodiment Example 2, the color rendering index (R9) of the red region may be 76.3.

That is, the embodiment improves the color rendering index, and the light flux can be improved as the wavelength of light in the red wavelength region becomes shorter.

Hereinafter, an illumination system in which the light emitting device package 200 having the above-described phosphor composition is disposed will be described.

The light emitting device or the light unit according to the embodiment can be applied to the illumination system. The lighting system includes a structure in which a plurality of light emitting devices are arrayed, and includes a display apparatus shown in FIGS. 10 and 11, a lighting apparatus shown in FIG. 12, and may include an illumination lamp, a traffic light, a vehicle headlight.

Figure 10:
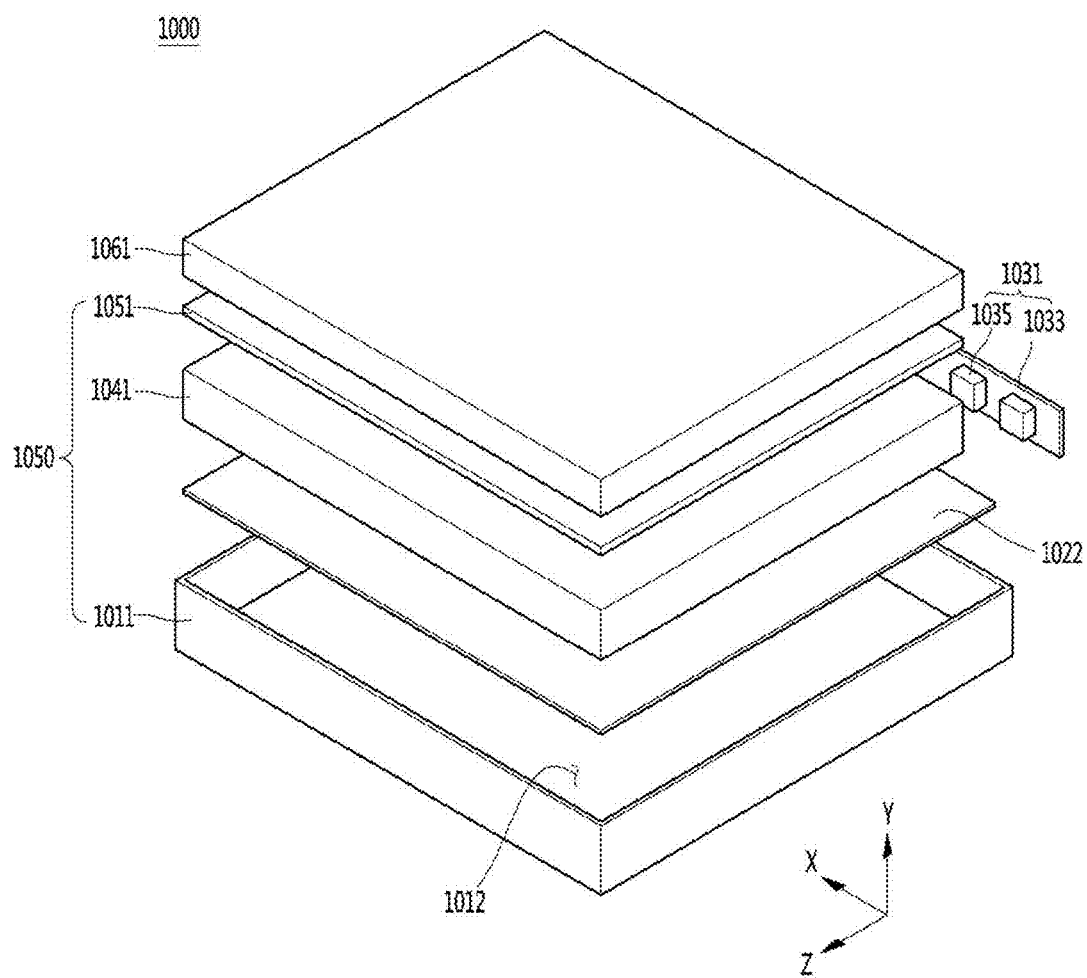
FIG. 10 is a perspective view showing a display device including a light emitting device according to an embodiment.

FIG. 10 is an exploded perspective view of a display device having a light emitting device according to an embodiment.

Referring to FIG. 10, a display device 1000 according to an embodiment includes a light guide plate 1041, a light source module 1031 for providing light to the light guide plate 1041, and a reflection member 1022, an optical sheet 1051 on the light guide plate 1041, a display panel 1061 on the optical sheet 1051, the light guide plate 1041, the light source module 1031, and the reflection member 1022, but it is not limited thereto.

The bottom cover 1011, the reflective sheet 1022, the light guide plate 1041, and the optical sheet 1051 can be defined as a light unit 1050.

The light guide plate 1041 serves to diffuse light into a surface light source. The light guide plate 1041 may be made of a transparent material such as acrylic resin such as polymethyl methacrylate (PET), polyethylene terephthalate (PET), polycarbonate (PC), cycloolefin copolymer (COC), and polyethylene naphthalate (PEN) Resin.

The light source module 1031 provides light to at least one side of the light guide plate 1041, and ultimately acts as a light source of the display device. The light source module 1031 includes at least one light source module 1031 and may directly or indirectly provide light from one side of the light guide plate 1041. The light source module 1031 includes a substrate 1033 and a light emitting device 1035 according to the embodiment described above and the light emitting devices 1035 may be arrayed on the circuit substrate 1033 at predetermined intervals.

The circuit board 1033 may be a printed circuit board (PCB) including a circuit pattern (not shown). However, the substrate 1033 may include not only a general PCB but also a metal core PCB (MCPCB), a flexible PCB (FPCB), and the like, but the present invention is not limited thereto. When the light emitting device 1035 is mounted on the side surface of the bottom cover 1011 or on the heat radiation plate, the circuit board 1033 can be removed. Here, a part of the heat dissipation plate may contact the upper surface of the bottom cover 1011.

The plurality of light emitting devices 1035 may be mounted on the circuit board 1033 such that the light emitting surface of the plurality of light emitting devices 1035 is spaced apart from the light guiding plate 1041 by a predetermined distance. The light emitting device 1035 may directly or indirectly provide light to the light-incident portion, which is one surface of the light guide plate 1041, but is not limited thereto.

The reflective member 1022 may be disposed under the light guide plate 1041. The reflection member 1022 reflects the light incident on the lower surface of the light guide plate 1041 so as to face upward, thereby improving the brightness of the light unit 1050. The reflective member 1022 may be formed of, for example, PET, PC, or PVC resin, but is not limited thereto. The reflecting member 1022 may be the upper surface of the bottom cover 1011, but is not limited thereto.

The bottom cover 1011 may receive the light guide plate 1041, the light source module 1031, the reflective member 1022, and the like. To this end, the bottom cover 1011 may be provided with a receiving portion 1012 having a box-like shape with an opened top surface, but the present invention is not limited thereto. The bottom cover 1011 may be coupled to the top cover, but is not limited thereto.

The bottom cover 1011 may be formed of a metal material or a resin material, and may be manufactured using a process such as press molding or extrusion molding. In addition, the bottom cover 1011 may include a metal or a non-metal material having good thermal conductivity, but the present invention is not limited thereto.

The display panel 1061 is, for example, an LCD panel, including first and second transparent substrates facing each other, and a liquid crystal layer interposed between the first and second substrates. A polarizing plate may be attached to at least one surface of the display panel 1061, but the present invention is not limited thereto. The display panel 1061 displays information by light passing through the optical sheet 1051. Such a display device 1000 can be applied to various kinds of portable terminals, monitors of notebook computers, monitors of laptop computers, televisions, and the like.

The optical sheet 1051 is disposed between the display panel 1061 and the light guide plate 1041 and includes at least one light transmitting sheet. The optical sheet 1051 may include at least one of a sheet such as a diffusion sheet, a horizontal and vertical prism sheet, and a brightness enhancement sheet. The diffusion sheet diffuses incident light. The horizontal or/and vertical prism sheet condenses incident light into a display area. The brightness enhancing sheet enhances brightness by reusing the lost light. A protective sheet may be disposed on the display panel 1061, but the protective sheet is not limited thereto.

Here, the optical path of the light source module 1031 may include the light guide plate 1041 and the optical sheet 1051 as an optical member, but the invention is not limited thereto.

Figure 11:
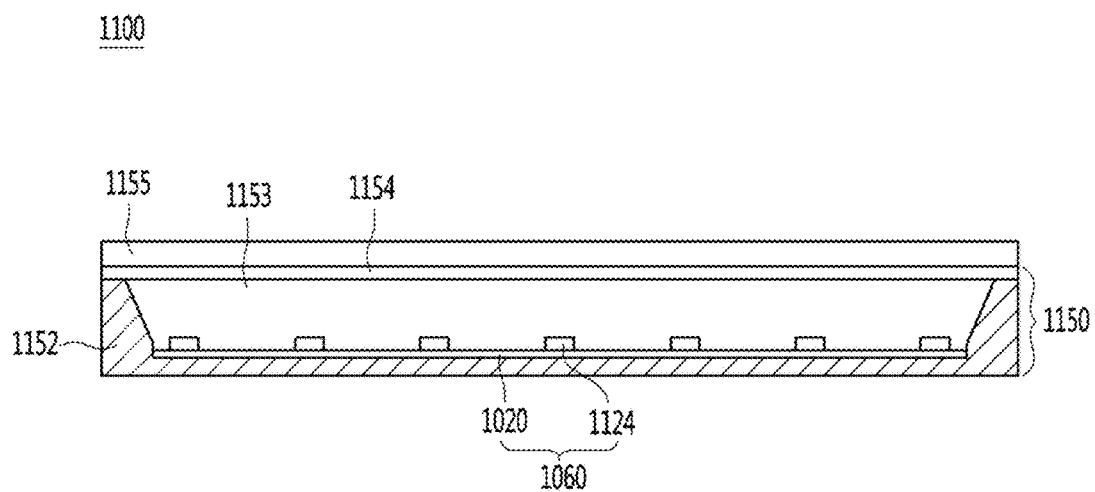
FIG. 11 is a perspective view showing a display device including a light emitting device according to an embodiment.

FIG. 11 is a view showing a display device having a light emitting device according to the embodiment.

Referring to FIG. 11, the display device 1100 includes a bottom cover 1152, a circuit board 1120 in which the above-described light emitting device 1124 is arrayed, an optical member 1154, and a display panel 1155.

The circuit board 1120 and the light emitting device 1124 may be defined as a light source module 1160. The bottom cover 1152, the at least one light source module 1160, and the optical member 1154 may be defined as a light unit 1150. The bottom cover 1152 may include a receiving portion 1153, but the present invention is not limited thereto. The light source module 1160 includes a circuit board 1120 and a plurality of light emitting devices 1124 arranged on the circuit board 1120.

Here, the optical member 1154 may include at least one of a lens, a light guide plate, a diffusion sheet, a horizontal and vertical prism sheet, and a brightness enhancement sheet. The light guide plate may be made of PC material or PMMA (poly methyl methacrylate), and the light guide plate may be removed. The diffusion sheet diffuses incident light. The horizontal and vertical prism sheets condense incident light into a display area. The brightness enhancing sheet improves the brightness by reusing the lost light.

The optical member 1154 is disposed on the light source module 1160 and performs surface light source, diffusion, and light condensation on the light emitted from the light source module 1160.

Figure 12:
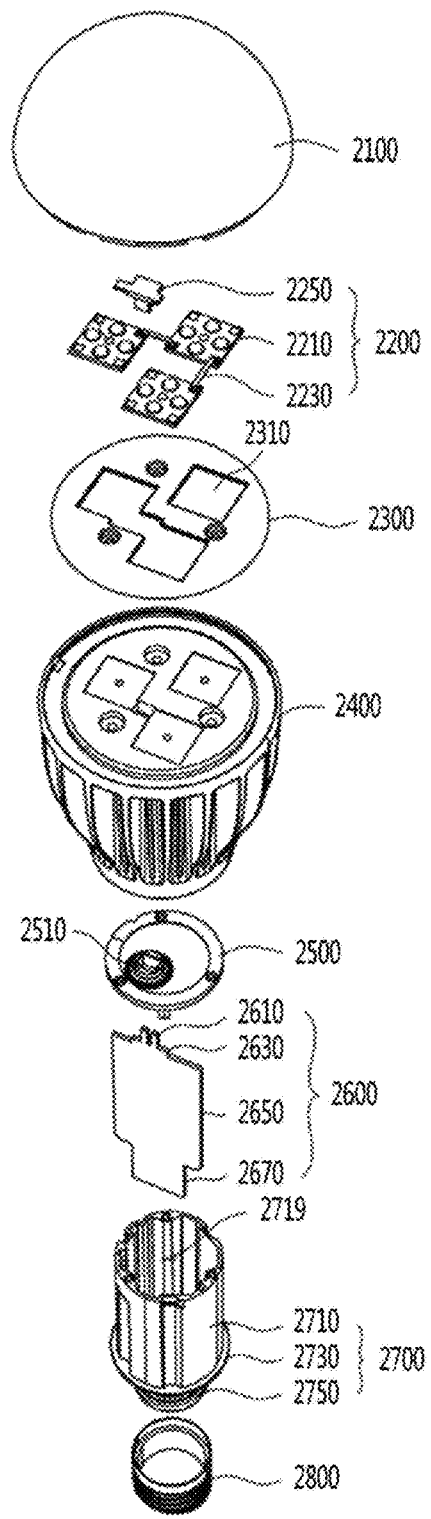
FIG. 12 is an exploded perspective view showing a lighting device including a light emitting device according to an embodiment.

FIG. 12 is an exploded perspective view of a lighting device having a light emitting device according to an embodiment.

Referring to FIG. 12, the lighting apparatus according to the embodiment includes a cover 2100, a light source module 2200, a heat discharger 2400, a power supply unit 2600, an inner case 2700, and a socket 2800. Further, the illumination device according to the embodiment may further include at least one of the member 2300 and the holder 2500. The light source module 2200 may include a light emitting device according to an embodiment.

For example, the cover 2100 may have a shape of a bulb or a hemisphere, and may be provided in a shape in which the hollow is hollow and a part is opened. The cover 2100 may be optically coupled to the light source module 2200 and may be coupled to the heat discharger 2400. The cover 2100 may have an engaging portion that engages with the heat discharging body 2400.

A milky white paint having a diffusion material may be coated on the inner surface of the cover 2100. The light from the light source module 2200 can be scattered and diffused to emit to the outside using the milky white material.

The cover 2100 may be made of glass, plastic, polypropylene (PP), polyethylene (PE), polycarbonate (PC), or the like. Here, polycarbonate is excellent in light resistance, heat resistance and strength. The cover 2100 may be transparent so that the light source module 2200 is visible from the outside, and may be opaque. The cover 2100 may be formed by blow molding.

The light source module 2200 may be disposed on one side of the heat discharging body 2400. Accordingly, the heat from the light source module 2200 is conducted to the heat discharging body 2400. The light source module 2200 may include a light emitting device 2210, a connection plate 2230, and a connector 2250.

The member 2300 is disposed on an upper surface of the heat discharging body 2400 and has guide grooves 2310 into which a plurality of illumination elements 2210 and a connector 2250 are inserted. The guide groove 2310 corresponds to the substrate of the illumination device 2210 and the connector 2250.

The surface of the member 2300 may be coated or coated with a white paint. The member 2300 reflects the light reflected by the inner surface of the cover 2100 toward the cover 2100 in the direction toward the light source module 2200. Therefore, the light efficiency of the illumination device according to the embodiment can be improved.

The member 2300 may be made of an insulating material, for example. The connection plate 2230 of the light source module 2200 may include an electrically conductive material. Therefore, electrical contact may be made between the heat discharging body 2400 and the connecting plate 2230. The member 2300 may be formed of an insulating material to prevent an electrical short circuit between the connection plate 2230 and the heat discharging body 2400. The heat discharger 2400 receives heat from the light source module 2200 and heat from the power supply unit 2600 to dissipate heat.

The holder 2500 blocks the receiving groove 2719 of the insulating portion 2710 of the inner case 2700. Therefore, the power supply unit 2600 housed in the insulating portion 2710 of the inner case 2700 is sealed. The holder 2500 has a guide protrusion 2510. The guide protrusion 2510 may have a hole through which the protrusion 2610 of the power supply unit 2600 passes.

The power supply unit 2600 processes or converts an electrical signal provided from the outside and provides the electrical signal to the light source module 2200. The power supply unit 2600 is housed in the receiving groove 2719 of the inner case 2700 and is sealed inside the inner case 2700 by the holder 2500.

The power supply unit 2600 may include a protrusion 2610, a guide unit 2630, a base 2650, and an extension unit 2670.

The guide portion 2630 has a shape protruding outward from one side of the base 2650. The guide portion 2630 may be inserted into the holder 2500. A plurality of parts may be disposed on one side of the base 2650. The plurality of components may include, for example, a DC converter, a driving chip for controlling driving of the light source module 2200, an electrostatic discharge (ESD) protection device for protecting the light source module 2200, the present invention is not limited thereto.

The extending portion 2670 has a shape protruding outward from the other side of the base 2650. The extension portion 2670 is inserted into the connection portion 2750 of the inner case 2700 and receives an external electrical signal. For example, the extension portion 2670 may be provided to be equal to or smaller than the width of the connection portion 2750 of the inner case 2700. The extension 2670 may be electrically connected to the socket 2800 through a wire.

The inner case 2700 may include a molding part together with the power supply part 2600. The molding part is a part where the molding liquid is hardened, so that the power supply part 2600 can be fixed inside the inner case 2700.

By using the phosphor composition or the light emitting device package of the embodiment described above in the case of the video display device and the lighting device described above, the light flux and the color reproduction rate can be improved. In addition, under the high temperature condition, it is possible to reduce the decrease in the optical characteristics of the light emitting device and improve the reliability.

While the present invention has been described with reference to exemplary embodiments, it is to be understood that the invention is not limited to the disclosed exemplary embodiments, but, on the contrary, is intended to cover various modifications and equivalent arrangements included within the spirit and scope of the appended claims. It will be understood that various modifications and applications are possible. For example, each component specifically shown in the embodiments can be modified and implemented. It is to be understood that the present invention may be embodied in many other specific forms without departing from the spirit or essential characteristics thereof.

The invention claimed is:

1. A phosphor composition comprising: a first phosphor excited by the excitation light source to emit light in a first wavelength range;
   a second phosphor excited by the excitation light source to emit light in a second wavelength range; and
   a third phosphor that is excited by the excitation light source and emits light in a third wavelength range,
   wherein the third phosphor includes at least one of a nitride-based fluorescent material and a silicate-based fluorescent material,
   the silicate-based fluorescent material comprises $K_2Si_{1-x}F_6:Mn^{4+}{}_x$, wherein the first wavelength region, the second wavelength region, and the third wavelength region are different each other, and
   wherein the first phosphor is a blue-green phosphor.

2. The phosphor composition according to claim 1, wherein an emission center wavelength of the first phosphor is from 490 nm to 505 nm.

3. The phosphor composition according to claim 1, wherein an emission center wavelength of the second phosphor is 515 nm to 570 nm.

4. The phosphor composition according to claim 1, wherein an emission center wavelength of the third phosphor is from 580 nm to 670 nm.

5. The phosphor according to claim 1, wherein the first phosphor comprises one of represented by the formula $(Ba, Mg)_{3-a}Si_{6-b}O_{3.5-c}N_{8.5-d}(Li, Cl, F, P)_{1-e}:Eu^{2+}{}_a$, $(Ba, Mg, Ca, Sr)_{3-a}Si_6O_3N_8:Eu^{2+}{}_a$ and $(Ba, Mg, Ca, Sr)_{1-a}Si_2O_2N_2:Eu^{2+}{}_a$.

6. The phosphor according to claim 1, wherein the second phosphor is at least one selected from the group consisting of $(Lu, Y, Gd)_{3-x}(Al, Ga)_5O_{12}:Ce^{3+}{}_x$ 및 $La_{3-x}Si_6N_{11}:Ce^{3+}{}_x$.

7. The phosphor according to claim 1, wherein the third phosphor is at least one selected from the group consisting of $(Ca, Sr)_{1-x}AlSiN_3:Eu^{2+}{}_x$, $(Ca)_{1-x}AlSiN_3:Eu^{2+}{}_x$, $Sr_{2-x}Si_5N_8:Eu^{2+}{}_x$ and $(Ba, Sr)_{2-x}Si_5N_8:Eu^{2+}{}_x$.

8. The phosphor according to claim 7, wherein a weight ratio of the first phosphor is from 1 wt % to 10 wt %, a weight ratio of the second phosphor is from 35 wt % to 55 wt %, the $(Ca, Sr)_{1-x}AlSiN_3:Eu^{2+}{}_x$ of the third phosphor is a weight ratio of 1 wt % to 10 wt %, and $K_2Si_{1-x}F_6:Mn^{4+}{}_x$ of the third phosphor is a weight ratio of 40 wt % to 60 wt %.

9. A light emitting device package comprising:
   a body portion;
   a first electrode portion and a second electrode portion disposed on the body portion;
   a light emitting device disposed on the body portion and electrically connected to the first electrode portion and the second electrode portion; and
   a molding portion around the light emitting device and including the phosphor composition of claim 1.

10. The light emitting device package according to claim 9, wherein the phosphor composition is contained in the molding part in a weight ratio of 65 wt % to 85 wt %.

11. The light emitting device package according to claim 9, wherein the light emitting device package emits white light.

12. A lighting device comprising the light emitting device package of claim 9 as a light source.

13. The phosphor according to claim 1, wherein the first phosphor emits cyan light of the first wavelength range.

14. The phosphor according to claim 1, wherein the first phosphor comprises an oxynitrides blue-green phosphor.

15. The phosphor according to claim 1, wherein the first phosphor comprises a silicate blue-green phosphor.

16. The phosphor according to claim 1, wherein the third phosphor comprises both $(Ca, Sr)_{1-x}AlSiN_3:Eu^{2+}{}_x$ red phosphor and KSF red phosphor.

17. The phosphor according to claim 16, wherein the KSF red phosphor is $K_2Si_{1-x}F_6:Mn^{4+}{}_x$.

18. The light emitting device package according to claim 9, wherein the third phosphor comprises both $(Ca, Sr)_{1-x}AlSiN_3:Eu^{2+}{}_x$ red phosphor and KSF red phosphor.

19. The light emitting device package according to claim 18, wherein the first phosphor emits cyan light of the first wavelength range.

20. The lighting device according to claim 12, wherein the third phosphor comprises both $(Ca, Sr)_{1-x}AlSiN_3:Eu^{2+}{}_x$ red phosphor and KSF red phosphor.

* * * * *